US009185784B2

(12) United States Patent
Gray et al.

(10) Patent No.: US 9,185,784 B2
(45) Date of Patent: Nov. 10, 2015

(54) LINE SYNCHRONIZED ELECTRICAL DEVICE AND CONTROLLING METHOD THEREOF

(75) Inventors: Richard Landry Gray, Saratoga, CA (US); Po Ming Tsai, Taipei (TW)

(73) Assignee: Richard Landry Gray, Saratoga, CA (US)

( * ) Notice: Subject to any disclaimer, the term of this patent is extended or adjusted under 35 U.S.C. 154(b) by 1295 days.

(21) Appl. No.: 12/994,766

(22) PCT Filed: May 14, 2009

(86) PCT No.: PCT/US2009/044044
§ 371 (c)(1), (2), (4) Date: Nov. 26, 2010

(87) PCT Pub. No.: WO2009/148789
PCT Pub. Date: Dec. 10, 2009

(65) Prior Publication Data
US 2011/0080104 A1 Apr. 7, 2011

Related U.S. Application Data

(60) Provisional application No. 61/130,607, filed on Jun. 2, 2008.

(51) Int. Cl.
*H05B 41/24* (2006.01)
*G05B 24/02* (2006.01)
*H03L 7/06* (2006.01)
*H05B 41/392* (2006.01)
*H05B 41/40* (2006.01)

(52) U.S. Cl.
CPC ............ *H05B 41/3927* (2013.01); *H05B 41/40* (2013.01)

(58) Field of Classification Search
CPC ......... H05B 37/00; H05B 37/02; H05B 41/24
USPC .................. 315/224, 246–287, 291; 327/156
See application file for complete search history.

*Primary Examiner* — Douglas W Owens
*Assistant Examiner* — Jonathan Cooper

(57) ABSTRACT

A controlling method for an electrical apparatus and a device thereof are provided in the present invention. The method includes the steps of: (a) providing an electrical apparatus and an AC power; (b) generating a control signal synchronized to the AC power; and (c) controlling the electrical apparatus by the control signal. The device includes a threshold detector, a phase-locked loop coupled to the threshold crossing detector and an output circuit coupled to the phase-locked loop.

14 Claims, 15 Drawing Sheets

100

LINE SYNCHRONIZED ELECTRICAL DEVICE AND CONTROLLING METHOD THEREOF

This application claims priority benefit under 35 USC 119 of PCT patent application, Ser. No PCT/US2009/044004, Filed May 14, 2009, and is published in English under PCT Article 21(2); which in turn claims priority of provisional patent application Ser. No. 61/130,607, filed Jun. 2, 2008.

FIELD OF THE INVENTION

The present invention relates to a controlling method and a control device. More particularly, it relates to a controlling method and a device to control an electrical apparatus by using a control signal synchronized with an AC power.

BACKGROUND OF THE INVENTION

The change from incandescent lighting to more efficient forms of electrical lighting has been, and will continue to be, the dominant trend in lighting. As the cost of electricity increases, the move to lighting solutions that provide more light output for less power (lumens per watt) becomes economically viable despite the higher initial costs of the more efficient lighting systems. Specifically, fluorescent lighting is one of the most efficient and cost-effective forms of electrical lighting. Within the fluorescent lighting family there are many types, such as CFL (compact fluorescent lamps), CCFL (cold cathode fluorescent lamps) and HCFL (hot cathode fluorescent lamps). Other efficient forms of lighting that exist now but are in earlier stages of development are WLED (white light emitting diode) and CNT (carbon nano-tube) lighting.

No matter which form of next generation lighting one chooses, a further increase in energy savings can be achieved if the lighting system is only run at the power level that one needs at a particular time. For instance, in a home application, one might use a reading light at full power while reading a book but then turn it to a very low power setting to act as a night light. In an industrial or office setting it may be advantageous to dim the lights during non-work hours in order to save electricity but maintain a certain level of security. It may also be advantageous to dim interior lights when office lighting is partially provided by another source such as sunlight shining through office windows.

For many types of lighting, specifically for the ones listed above, i.e., CFL, CCFL, HCFL, WLED and CNT, a particularly efficient means of dimming is called PWM (pulse width modulation) dimming (it also goes by other names such as burst mode dimming or duty factor dimming). During PWM dimming the light source is turned on and off at a frequency too fast for the human eye to detect. The duty cycle of the on and off periods can theoretically be varied from 0% to 100%. Each time the lamp is on, it runs at its full power (which is usually picked to be the most efficient area of operation for that particular lamp); when the lamp is off it dissipates no power. PWM dimming frequencies on the order of 100 Hz to 1 kHz are common.

There are several problems with using PWM dimming (or any form of dimming) for general purpose home or office lighting applications. The first significant problem is how one controls the level of dimming for the lamp without requiring a separate control signal or separate control wiring. For instance, one can imagine rewiring a house so that each ceiling lamp has an extra control circuit running to it. These extra wires would return to a place within easy reach of the user, and some control electronics would need to be located in the lamp and at the position within easy reach of the user. An even more sophisticated system might use radio control or IR (infrared) systems to communicate with the individual lighting devices. There is nothing technically wrong with these methods of providing dimming for residential or commercial lighting; however the initial cost of adding the extra wiring or the cost of retrofitting an existing wiring system to include the extra control wiring would, in most cases, be prohibitive, as would using radio or IR controlled appliances.

The second major problem involves synchronizing the outputs of multiple lamps so that their brightnesses do not vary significantly enough to be noticed by the user. It turns out that PWM mode dimming is an effective way to do this if one can ensure that the duty cycle of each lamp is the same. How may one communicate to each lamp that they should all be running at a 50% duty cycle? If one runs separate control circuits to each lamp, so that each lamp may be pulsed on and off by the same signal, then one still has the same problem alluded to in the previous paragraph, i.e., increased wiring costs and complexity.

If one solves the problem of ensuring that all the lamps are running at the same dimming duty cycle then one must also ensure that the dimming frequency is the same for all the lamps in the same vicinity. If the dimming frequency of each of the different lamps varies from all others then it is possible that the differences among the lamps' frequencies could be small enough that it would produce a time dependent change in brightness that would be noticeable to human beings. This effect is called "beating," and it is well known in the area of notebook computer back-lighting where the dimming frequency of the back-light may "beat" with the scan frequency of the display and produce visual irregularities in the display that are noticeable to the user.

Therefore, it would be useful to invent a method and a control device to circumvent all the above issues. In order to fulfill this need the inventors have proposed an invention "LINE SYNCHRONIZED ELECTRICAL DEVICE AND CONTROLLING METHOD THEREOF." The summary of the present invention is described as follows.

SUMMARY OF THE INVENTION

The object of the present invention is to provide a line synchronized control method and a line synchronized control device generating a pulse width modulated (PWM) control signal in order to control an electrical apparatus. In particular the PWM control signal, with a frequency of multiples of a predetermined frequency (such as an AC power line frequency), is synchronized to an AC power line voltage. For instance, the present invention can be applied to dimming lights to ensure that the "beating" phenomenon will no longer exist because the same dimming duty cycle and dimming frequency of all the lamps using the same AC power supply will be the same. The invention disclosed in this application is also realizable for a cost that is low enough to make it attractive for high volume applications as well as useful for high-end lighting applications. Please note that the ultimate output of this device may be a signal that is derived from the PWM output as well as the PWM output itself.

According to the first aspect of the present invention, a line synchronized control device includes (1) a threshold crossing detector receiving a first input signal, detecting a first threshold crossing of the first input signal and generating a first output signal having a first specific frequency upon the detection of the first threshold crossing of the first input signal; (2) a phase-locked loop coupled to the threshold crossing detector and generating a second output signal having a second specific frequency which are multiples of the first specific frequency and synchronized to the first output signal; (3) and an output circuit coupled to the phase-locked loop, receiving a second input signal and generating a control signal having the second specific frequency, synchronized to the first output signal and having a specific duty cycle determined by the second input signal to control an electrical apparatus.

Preferably the line synchronized control device will provide circuitry wherein the specific duty cycle is a predetermined value selected from a group consisting of 25%, 50%, 75% and 100%.

Preferably the line synchronized control device further includes a sensor providing the second input signal and coupled to the duty cycle selector wherein the duty cycle selector selects the specific duty cycle.

Preferably the line synchronized control device will provide circuitry wherein the sensor is a brightness sensor, the output circuit is an analog PWM generator and the brightness sensor and the analog PWM generator form an analog PWM feedback loop having a switching frequency synchronized to the second specific frequency.

Preferably the line synchronized control device will provide circuitry wherein the analog PWM generator includes: a one-shot circuit coupled to the phase-locked loop; a ramp generator coupled to the one-shot circuit and providing a ramp signal having the second specific frequency; a comparator coupled to the ramp generator; an error integrator coupled to the comparator and the brightness sensor; and a voltage reference coupled to the error integrator and providing a predetermined reference signal wherein the control signal is a PWM signal and is generated by the comparator.

Preferably the line synchronized control device will provide circuitry wherein the predetermined reference signal is adjusted by a power supply interruption, and the specific duty cycle of the control signal is determined by the second input signal, the ramp signal and the predetermined reference signal.

Preferably the line synchronized control device further includes a plurality of states respectively representing a plurality of duty cycles including the specific duty cycle wherein the plurality of states has an initial state, the duty cycle of the initial state is set by the sensor and the output circuit selects the specific duty cycle by interpreting a sequence of power supply interruptions.

Preferably the line synchronized control device further includes: an alternating current line under-voltage detector (AC Line UV Detector) receiving a third input signal and generating a third output signal if the third input signal is below a second threshold; an interrupt duration qualifier coupled to the AC Line UV Detector and generating a fourth output signal according to the third output signal; and a finite state machine coupled to the interrupt duration qualifier and the output circuit, selecting a specific state according to the fourth output signal and generating the second input signal.

Preferably the line synchronized control device will provide circuitry wherein the threshold crossing detector is a zero crossing detector (detects zero current or zero voltage), the output circuit is a duty cycle selector, the first input signal is an AC power line voltage and the control signal is a pulse width modulated (PWM) control signal synchronized to the AC power line and having a frequency being some multiple of an AC power line frequency.

Preferably the line synchronized control device's third output signal has a continuing duration determined by a period between two time points of turning the AC power line voltage off and then on; the interrupt duration qualifier ceases to generate an additional signal if the continuing duration is shorter than a first predetermined period; the interrupt duration qualifier generates a valid signal to the finite state machine to move the specific state to a next state if the continuing duration is larger than the first predetermined period but shorter than a second predetermined period; and the interrupt duration qualifier generates a reset signal to the finite state machine to reset the specific state to an initial state if the continuing duration is larger than the second predetermined period.

Preferably the line synchronized control device will provide circuitry wherein the finite state machine further comprises the initial state with a power level of the apparatus set at 25%, a second state with a power level of the apparatus set at 50%, a third state with a power level of the apparatus set at 75%, a fourth state with a power level of the apparatus set at 100%, a fifth state with a power level of the apparatus set at 75% and a sixth state with a power level of the apparatus set at 50%, followed by a repetition of those states. The selection of 25%, 50%, 75% and 100% is mostly due to convenience. With proper digital circuitry almost any duty cycle could be obtained by logical operations involving integer multiples of the line frequency as provided by the phase locked loop.

Preferably the line synchronized control device controls a lighting device having a ballast (also known as a regulator) coupled to the control device and an exterior dimension of a T-x (T-x refers to fluorescent lamp sizes such as T-2, T-5, T-8) form factor or an Edison base bulb or other standard lamp form factor, and the control device is configured in the lighting device and controls the power levels of the electrical apparatus by the PWM control signal. Furthermore, the line synchronized control device can be configured in the ballast, and the lighting device has at least one cold cathode fluorescent lamp (CCFL).

Preferably the line synchronized control device is part of a larger circuit that includes a switch to turn the AC power line voltage off and then on for a specific time, and is further coupled to a ballast, at least one lamp and a rectifier circuit. This rectifier circuit includes a first and a second input terminals receiving the AC power line voltage; a first output terminal coupled to the ballast (also known as a regulator) and providing a rectified direct current voltage; a second output terminal coupled to the AC Line UV Detector and providing the third input signal; a third output terminal coupled to a shunt (or other type of) regulator and providing a power to the invention; a fourth output terminal coupled to the zero-crossing detector and providing a voltage or current proportional to the AC line voltage; a ground terminal coupled to the regulator, other control electronics and the ballast coupled to the at least one lamp; a full bridge rectifier coupled to the first input terminal, the second input terminal, the first output terminal and the ground terminal; a first resistor coupled between the second input terminal and the fourth output terminal; a first capacitor serving as a filter and coupled between the first output terminal and the ground terminal; a resistor divider coupled to the first output terminal, the ground terminal and the second output terminal; a fourth resistor coupled to the first output terminal; and a second capacitor coupled between the fourth resistor and the ground terminal, storing an energy and providing the power.

According to the second aspect of the present invention, a line synchronized control device includes: (1) a differential voltage detector receiving a first input signal and a second input signal, generating a first output signal having a voltage level dependent on the polarity of the difference between the first and second input signals, the first output signal having a predetermined frequency equal to the frequency of the voltage difference of the first and second input signals; (2) an interrupt duration qualifier coupled to the differential voltage detector and generating a second output signal when a continuing duration of the first output signal is larger than a predetermined period; (3) a finite state machine coupled to the interrupt duration qualifier, selecting a specific state according to the second output signal and generating a third output signal; (4) a phase-locked loop coupled to the differential voltage detector and generating a fourth output signal having a second specific frequency which is a multiple of the first specific frequency and is synchronized to the first output signal; (5) and a duty cycle selector coupled to the finite state machine and the phase-locked loop and generating a pulse width modulated (PWM) control signal having the second specific frequency synchronized to the first output signal and having a specific duty cycle determined by the third output signal in order to control an electrical apparatus.

Preferably the line synchronized control device will provide circuitry wherein the first and second input signals are voltage signals, the difference is a voltage difference and the first output signal is one of a high voltage and a low voltage dependent on the polarity of the voltage difference.

Preferably the line synchronized control device will provide circuitry wherein the finite state machine further comprises: an initial state with a power level of the apparatus set at 100%; a second state with a power level of the apparatus set at 75%; a third state with a power level of the apparatus set at 50%; a fourth state with a power level of the apparatus set at 25%.

The order of these states is designed so that after progressing from a 100% power level to a 25% power level the next states would progress from 25% back up to 100%. This pattern of lowering and rising power levels would repeat itself ad infinitum. Note that the choice of 100%, 75%, 50% and 25% is arbitrary and although they are a convenient and useful choice there is nothing in the invention that restricts the power levels to those particular values.

Preferably the line synchronized control device further includes a shunt regulator, a ballast coupled to at least one lamp and a rectifier circuit wherein the rectifier circuit includes: a first and a second input terminal receiving an AC power line voltage; a first output terminal coupled to the ballast and providing a rectified direct current voltage; a second output terminal coupled to the differential voltage detector and providing the first input signal; a third output terminal coupled to the shunt regulator and providing a power; a fourth output terminal coupled to the differential voltage detector and providing the second input signal synchronized to the AC line voltage; and a ground terminal coupled to the rectifier circuit and the ballast.

According to the third aspect of the present invention, a controlling method for an electrical apparatus includes the steps of: (a) providing an AC power; (b) generating a control signal synchronized to the AC power; and (c) controlling an electrical apparatus by the control signal.

Preferably the control signal of the controlling method is one of a pulse width modulated (PWM) control signal and an analog control signal.

Preferably the PWM control signal of the controlling method is used for dimming the lighting device.

Preferably the controlling method is used for dimming wherein the AC power has a specific frequency and the PWM control signal has a specific duty cycle derived from multiples of the specific frequency.

Preferably the PWM control signal of the controlling method has a fixed frequency and a duty cycle of a specific performing value wherein the specific performing value is determined by an interruption of the AC power; and the interruption is an action of turning the AC power off and then on, executed at a specific time and having a specific duration.

Preferably the PWM control signal of the controlling method has a duty cycle of a specific performing value wherein the specific performing value is one of a plurality of predetermined values having magnitudes gradually changed, and the specific performing value is determined by the steps of: (b1) setting the specific performing value to a maximum one of the plurality of predetermined values; (b2) lowering the specific performing value from a first one of the plurality of predetermined values being the maximum predetermined value to a second predetermined value nearest to the first predetermined value according to the duration of the interruption until the specific performing value is set at a minimum one of the plurality of predetermined values; (b3) raising the specific performing value from the minimum predetermined value to a next one nearest the minimum predetermined value according to the duration of the interruption until the specific performing value is set at the maximum predetermined value; and (b4) returning to the step (b2).

Preferably the PWM control signal of the controlling method has a duty cycle of a specific performing value wherein the specific performing value is determined by the steps of: (b1) adjusting the specific performing value from a first one of the plurality of predetermined values to a second predetermined value adjacent to the first predetermined value if the duration of the interruption is larger than a first period but shorter than a second period; (b2) resetting the specific performing value to a maximum predetermined value if the duration of the interruption is larger than the second period; and (b3) maintaining the specific performing value if the duration of the interruption is shorter than the first period.

Preferably the PWM control signal of the controlling method has a duty cycle of a specific performing value wherein the specific performing value is one of a plurality of predetermined values having magnitudes gradually changed, and the specific performing value is determined by the steps of: (b1) setting the specific performing value to a minimum one of the plurality of predetermined values; (b2) raising the specific performing value from a first one of the plurality of predetermined values (being the minimum predetermined value) to a second predetermined value nearest to the first predetermined value according to the duration of the interruption until the specific performing value is set at a maximum one of the plurality of predetermined values; (b3) lowering the specific performing value from the maximum predetermined value to a next one nearest the maximum predetermined value according to the duration of the interruption until the specific performing value is set at the minimum predetermined value; and (b4) returning to the step (b2).

Preferably the PWM control signal of the controlling method has a duty cycle of a specific performing value wherein the specific performing value is one of a plurality of predetermined values having magnitudes gradually changed, and the specific performing value is determined by the steps of: (b1) setting the specific performing value at a maximum (one) of the plurality of predetermined values; (b2) automatically lowering the specific performing value from the maximum predetermined value to a minimum (one) of the plurality of predetermined values successively; (b3) stopping the step (b2) if the interruption is executed during the duration of the step (b2) wherein the specific performing value is set at the one of the plurality of predetermined values at the time of the interruption; (b4) automatically raising the specific performing value from the minimum predetermined value to the maximum predetermined value successively; and (b) stopping the step (b4) if the interruption is executed during the duration of the step (b4) wherein the specific performing value is set at one of the plurality of predetermined values at the time of the interruption. Note that the initial specific performing value can be set in response to a sensor or at some fixed value.

Preferably the above method further includes a step (b) of repeating the steps (b1) to (b4) to set the specific performing value between the maximum and the minimum predetermined values or other step (b6) of holding the specific performing value at the maximum predetermined value.

Preferably the PWM control signal of the controlling method has a duty cycle of a specific performing value wherein the step (b6) further comprises a step (b6a) of returning to the step (b2) if the interruption is executed when the specific performing value is held at the maximum predetermined value.

The above objects and advantages of the present invention will become more readily apparent to those ordinarily skilled in the art after reviewing the following detailed descriptions and accompanying drawings in which:

BRIEF DESCRIPTIONS OF THE DRAWINGS

FIG. 1 shows a first preferred embodiment of the present invention;

FIG. 2*a* shows a second preferred embodiment of the present invention;

FIG. 2*b* shows a modification of the second preferred embodiment of the present invention;

FIG. 2*c* shows an analog PWM control circuit of an analog PWM generator in FIG. 2*b*;

Figure 15A:
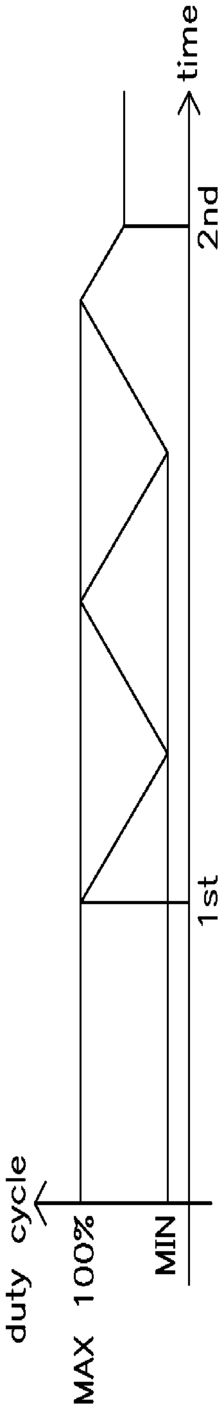
Figure 15B:
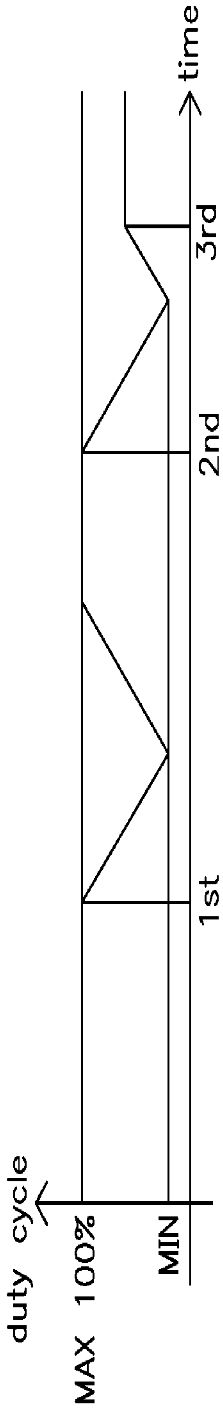

FIGS. 15*a*, and 15*b* which show duty cycle versus time diagrams of one device.

DETAILED DESCRIPTION OF THE PREFERRED EMBODIMENT

Figure 1:
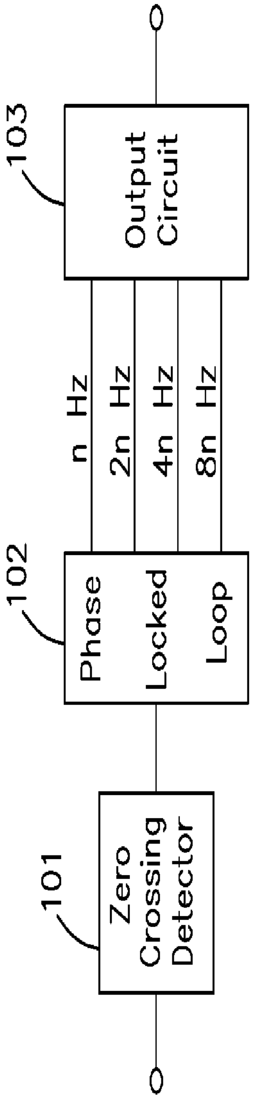

Please refer to FIG. 1 which shows a first preferred embodiment of the present invention. The first preferred embodiment is a line synchronized control device 100. This device 100 includes a zero crossing detector 101, a phase locked loop (PLL) 102 coupled to the zero crossing detector 101 and an output circuit 103 coupled to the PLL 102.

The zero crossing detector 101 detects when an AC power line voltage (a 60 Hz line voltage or similar) passes through a certain part of its voltage cycle. It is not necessary that this be the point when the voltage is actually zero. What is important is that it happens at the same part of the input voltage sinusoid on every cycle; in this way the frequency between different line synchronized control devices on the same AC line will be identical even though the phase difference between different line synchronized control devices will not be zero. (The phase difference between different units needs to be constant, not zero.) Note that a threshold crossing detector can be applied in the invention.

The output of the zero crossing detector 101 becomes the reference input for the PLL 102 whose outputs are multiples of the AC power line frequency. In this case the PLL 102 provides 60 Hz, 120 Hz, 240 Hz and 480 Hz. Those different frequencies are all synchronized and become the input to the output circuit 103.

The output circuit 103 uses combinational logic to construct PWM signals of 25%, 50% and 75% from the outputs of the PLL 102. Those different PWM signals are all synchronized back to the 60 Hz line voltage. A received signal can determine which of those signals should be used as the PWM control output. By adding higher multiples of the AC power line frequency PWM signals of almost any duty factor may be constructed. Note that the output circuit 103 could be a duty cycle selector. And the duty cycle selector selects from a group of duty cycles derived from logical combinations of multiples of the AC power line frequency.

Figure 2A:
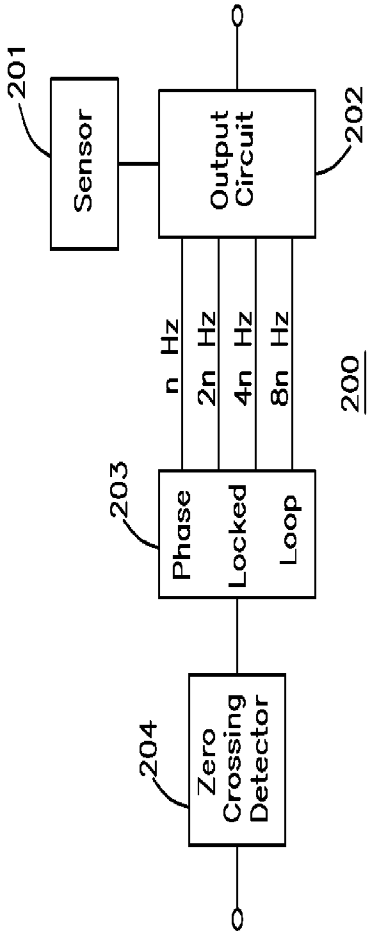

Please refer to FIG. 2*a*, which shows a second preferred embodiment of the present invention. The second preferred embodiment 200 includes a sensor 201 (most likely an ambient light sensor but in the most general case it could sense any physical property such as temperature, pressure, velocity etc.), an output circuit 202 coupled to the sensor 201, a PLL 203 coupled to the output circuit 202 and a zero crossing detector 204 coupled to the PLL 203. Particularly the sensor 201 outputs a signal to the output circuit 202 based on ambient light, temperature, pressure or other parameters in order to select a duty cycle for the PWM control signal of the output circuit 202. In this way the illumination in a room would stay constant even though another source of room light (such as sunlight) might be changing throughout the day.

Figure 2B:
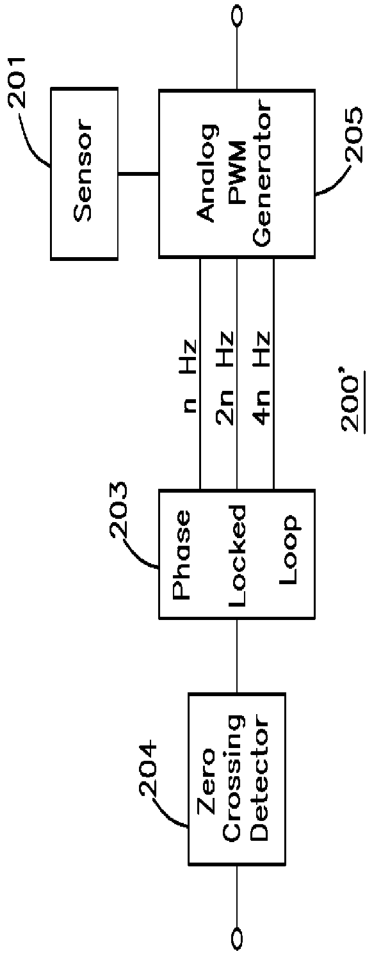

Please refer to FIG. 2*b* which shows a modification of the second preferred embodiment of the present invention. The controlling device 200' of FIG. 2*b* is similar to the embodiment of FIG. 2*a* except that the sensor 201 is coupled to an analog PWM generator 205 whose frequency of operation is synchronized to one of the line frequency multiples available from the PLL 203. If this was used in a lighting situation each controlling device 200' would provide a PWM brightness signal to a lamp ballast by which the signal from the sensor 201 would be adjusted to some predetermined threshold. In this situation the duty factor of the different lamps would vary from each other because the amount of sensed light would be different for each lamp; however, the frequency of each lamp's PWM brightness signal would still be identical to every lamp on the same AC line circuit, since each controlling device 200' derives its operating frequency from the AC line voltage.

Figure 2C:
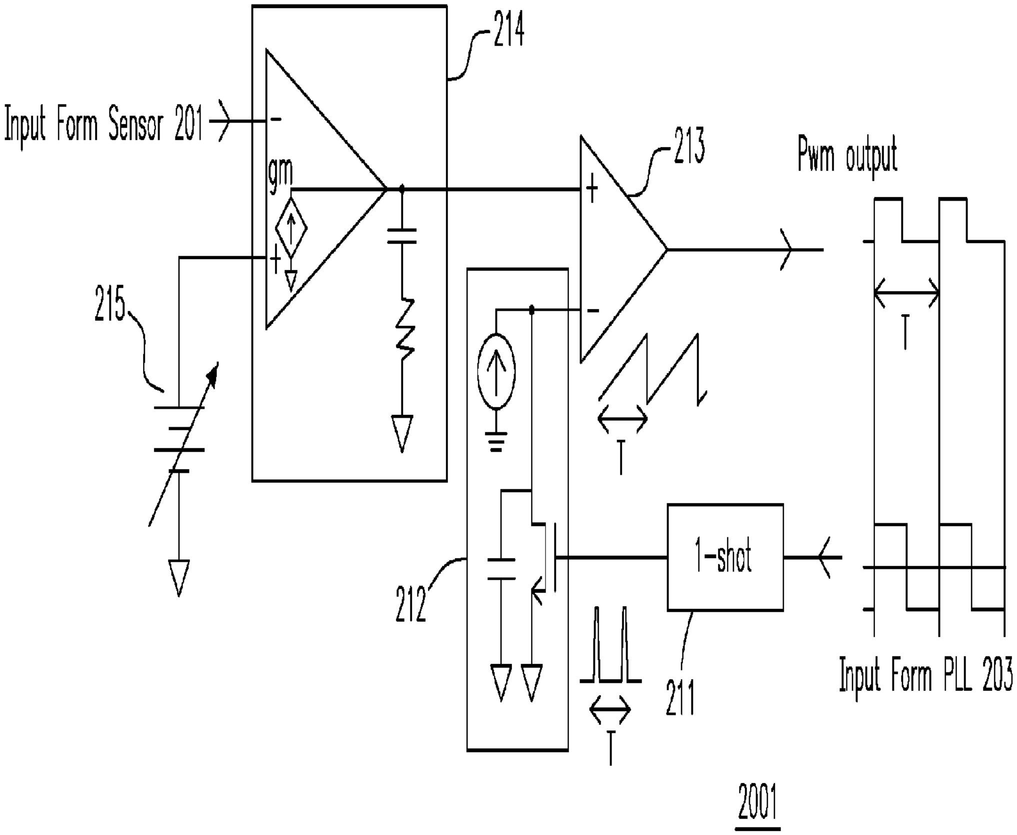

FIG. 2*c* shows an analog PWM control circuit of the analog PWM generator in FIG. 2*b*. The control circuit 2001 includes a one-shot circuit 211 coupled to the phase-locked loop 203; a ramp generator 212 coupled to the one-shot circuit 211 and providing a ramp signal having a specific frequency synchronized to one of the line frequency multiples available from the PLL 203; a comparator 213 coupled to the ramp generator 212; an error integrator 214 coupled to the comparator 213 and the sensor 201; and a voltage reference 215 coupled to the error integrator 214 and providing a predetermined reference signal. A PWM control signal is generated by the comparator 213.

The error integrator 214 senses the difference between a sensor signal from the sensor 201 and the predetermined reference signal. The predetermined reference signal can be adjusted by a power interruption or some other means, and the power interruption is an action of turning the AC power off and then on. The output of the error integrator 214 is a time integrated representation of the differential input voltage of the error integrator 214. The output of the error integrator 214 is compared against a triangular (usually a sawtooth) signal from the ramp generator 212 and the frequency of the triangular signal is some integer multiple of the AC line voltage. The output of this PWM comparator 213 forms the PWM control signal whose duty factor increases as the sensor voltage from the sensor 201 becomes lower than the predetermined reference voltage. The duty factor of the PWM comparator 213 output decreases as the sensor voltage becomes higher than the predetermined reference voltage. Note that for some feedback systems the polarity of the sensor signal gain (denoted by gm in the case of the transconductance error amplifier in FIG. 2*c*) might be reversed in which case the PWM output would require a polarity inversion. Also note that the PWM output may require a polarity inversion depending on the needs of the device to be controlled by the PWM output signal.

Figure 3:
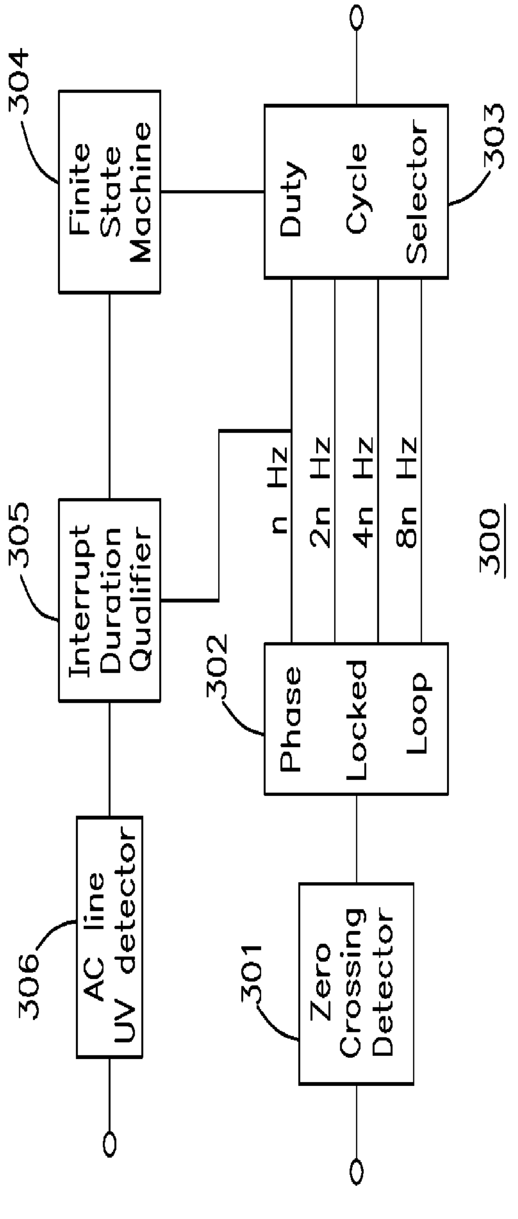
FIG. 3 shows a third preferred embodiment of the present invention.

Please refer to FIG. 3, which shows a third preferred embodiment of the present invention. The third preferred embodiment 300 includes a zero crossing detector 301 coupled to a PLL 302; a duty cycle selector 303 coupled between the PLL 302 and a finite state machine 304; and an interrupt duration qualifier 305 coupled between the finite state machine 304 and an alternating current line under-voltage detector (AC Line UV Detector) 306. The zero crossing detector 301, the PLL 302 and the duty cycle selector 303 function as the aforementioned line synchronized control device.

The AC Line UV Detector 306 senses a voltage proportional to a DC rectified voltage. When that voltage is below a certain threshold, it signals that a line voltage interruption has occurred. The interrupt duration qualifier 305 determines if the interrupt duration is a valid interrupt or not. If the interrupt is too short, then it is ignored. If the interrupt is longer than some minimum, $t_{min}$, and shorter than some maximum time, $t_{max}$, then it signals to the finite state machine (FSM) 304 with a programmed algorithm that the interrupt is valid. If the interrupt is longer than $t_{max}$, then it sends a signal to the FSM 304 indicating that the FSM 304 should be reset to its default state.

Valid interrupts cause the FSM 304 to move from one state to the next. In the preferred embodiment the duty cycle of the PWM control output changes from 100% to 75%, to 50% to 25% to 50% and so on. Note that the frequencies of those different PWM control signals are all synchronized back to the 60 Hz line voltage, and the FSM 304 determines which of those signals should be used as the PWM control output. Note that the interrupt duration qualifier 305 can be coupled to the PLL 302 so that the PLL 302 can provide an accurate time base to the interrupt duration qualifier 305, which provides precise interrupt duration qualification as well as being an efficient utilization of circuitry.

Figure 4:
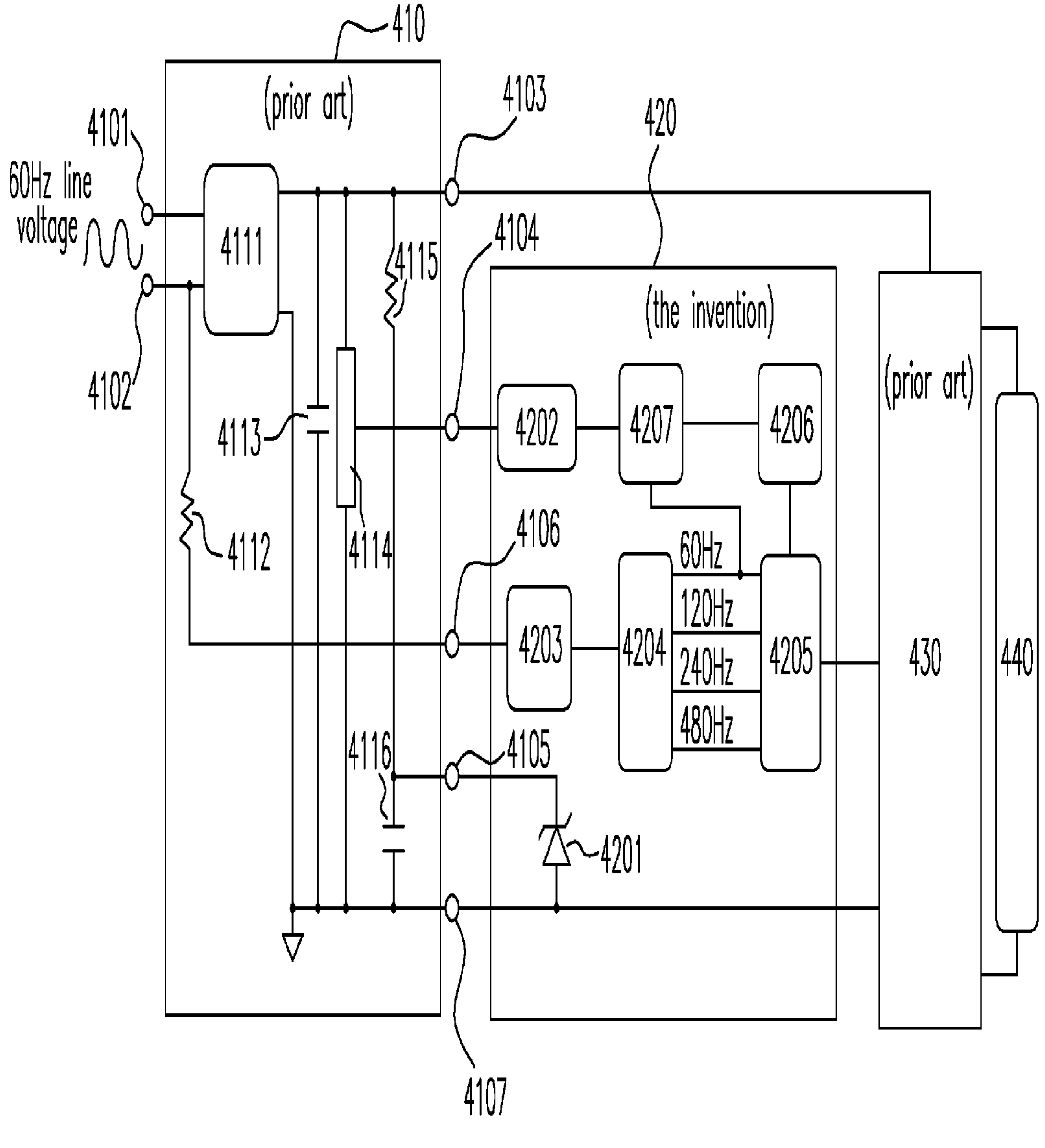
FIG. 4 shows a first application of the present invention used in a lamp.

Please refer to FIG. 4, which shows a first application of the present invention used in a lamp. In this application a rectifier circuit 410 is coupled to a control device 420 and a ballast 430; the ballast 430 is coupled to at least one lamp 440 such as a CCFL or other lamps described previously. The control device 420 functions as the third preferred embodiment 300 and comprises a zener diode 4201 as a shunt regulator, an AC line UV detector 4202, a zero crossing detector 4203, a PLL 4204, a duty cycle selector 4205, a finite state machine 4206 and an interrupt duration qualifier 4207.

The rectifier circuit 410 has: a first 4101 and a second 4102 input terminal receiving an AC power line voltage such as a 60 HZ line voltage; a first output terminal 4103 coupled to the ballast 430 and providing a rectified direct current voltage; a second output terminal 4104 coupled to the AC line UV Detector 4202; a third output terminal 4105 coupled to the shunt regulator 4201; a fourth output terminal 4106 coupled to the zero crossing detector 4203 and providing a first input signal synchronized to the AC power line voltage; and a ground terminal 4107 providing a GND potential for the invention's circuitry 420 and the ballast 430. Note that other types of voltage regulating devices could be substituted for shunt regulator 4201.

The rectifier circuit 410 further includes: a full bridge rectifier 4111 coupled to the first input terminal 4101, the second input terminal 4102, the first output terminal 4103 and the ground terminal 4107 for creating DC voltage from the AC power line voltage; a first resistor 4112 coupled between the second input terminal 4102 and the fourth output terminal 4106; a first capacitor 4113 used as a filter and coupled between the first output terminal 4103 and the ground terminal 4107 for smoothing out the ripples from the rectifier 4111; a resistor divider 4114 coupled to the first output terminal 4103, second output terminal 4104 and the ground terminal 4107; a second resistor 4115 coupled to the first output terminal 4103 for providing low voltage power to the control device 420; and a second capacitor 4116 coupled between the second resistor 4115 and the ground terminal 4107 for storing energy to keep the internal power supply of the control device 420 alive when the AC power line voltage is momentarily interrupted. Please note that providing power to the invention through resistor 4115 is not the only way to provide power to the control device 420. It is common to provide supply voltages to electronic components in these situations by using a tertiary winding off the switching circuitry of the ballast 430. However all these means are prior art and the particular means chosen by the system designer does not alter the efficacy of the invention.

The ballast 430 coupled to the duty cycle selector 4205 can control the brightness of the at least one lamp 440 by a PWM control signal proportional to the duty cycle of the PWM waveform from the duty cycle selector 4205. (This invention disclosure makes no attempt to define a particular lamp ballast.) Note that the PWM control signal has a frequency being integer multiples of a frequency derived from the AC power line voltage and is synchronized to the AC power line voltage so that the "beating" effect does not take place when dimming more than one lamp.

Importantly, the power supply to the control device 420 must remain valid for longer than the interval in which the power to the lamp is momentarily interrupted by the user in order to signal the desired brightness. This is not difficult to do because the control device's power supply current can be made so small that its supply can be maintained by a capacitor of reasonable size during the time that power to the lamp is interrupted. If this were not the case, then the control device 420 would "forget" the desired brightness setting and reset itself when power is next applied. With the addition of some non-volatile memory the desired brightness setting could be remembered indefinitely, but the addition of nonvolatile memory would increase the cost of the invention. It would also require circuitry to clear the non-volatile memory after a suitable time period or the circuit would not reset to its initial state after a valid power on reset.

In this application the invention has been shown as being separate from the ballast; however, ultimately users would wish to incorporate the invention's technology into the lamp's or other device's electronic ballast. This offers further cost and area savings. For instance the present invention can be further configured in a lighting device having an exterior dimension of a T-x form factor, an Edison base bulb or other standard lamp form factor. More specifically, the present invention can be configured in an electrical ballast used to drive a CCFL.

Figure 5:
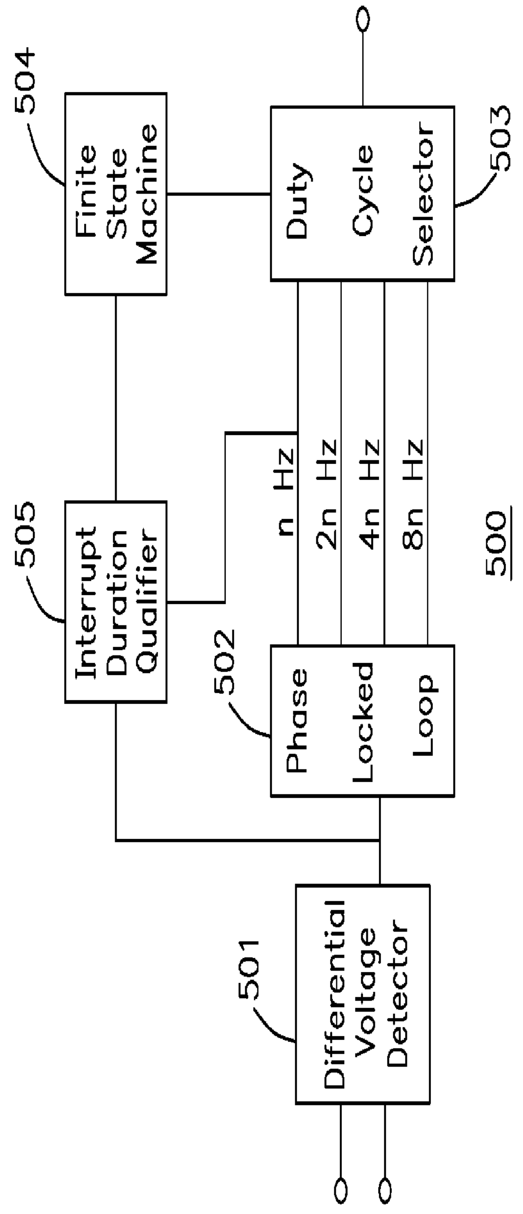
FIG. 5 shows a fourth preferred embodiment of the present invention.

Please refer to FIG. 5, which shows a fourth preferred embodiment of the present invention. The fourth preferred embodiment 400 includes a differential voltage detector 501 coupled to a PLL 502, a duty cycle selector 503 coupled between the PLL 502 and a finite state machine 504, and an interrupt duration qualifier 505 coupled between the finite state machine 504 and the differential voltagedetector 501. The fourth preferred embodiment 400 functions in the same manner as the third preferred embodiment 300; however the differential voltage detector 501 replaces an AC Line UV Detector 306 and a zero crossing detector 301. The differential voltage detector 501 not only functions to provide a signal whose frequency is the same as the frequency of the differential input voltage, but when that signal stops for a sufficient period of time the interrupt duration qualifier 505 will interpret that lack of signal as a valid power supply interruption. In this way an interruption of an AC power can be detected and the PWM control signal from the duty cycle selector 503 can be synchronized to the AC power line voltage as well. Furthermore, differential voltage detector 501 is generally known in the prior art to be less susceptible to noise on its input signals than single ended detectors such as the zero crossing detector 301. As before in the third preferred embodiment 300, the PLL 502 can also be coupled to the interrupt duration qualifier 505 in order to provide a stable time base for the interrupt duration qualifier.

Figure 6:
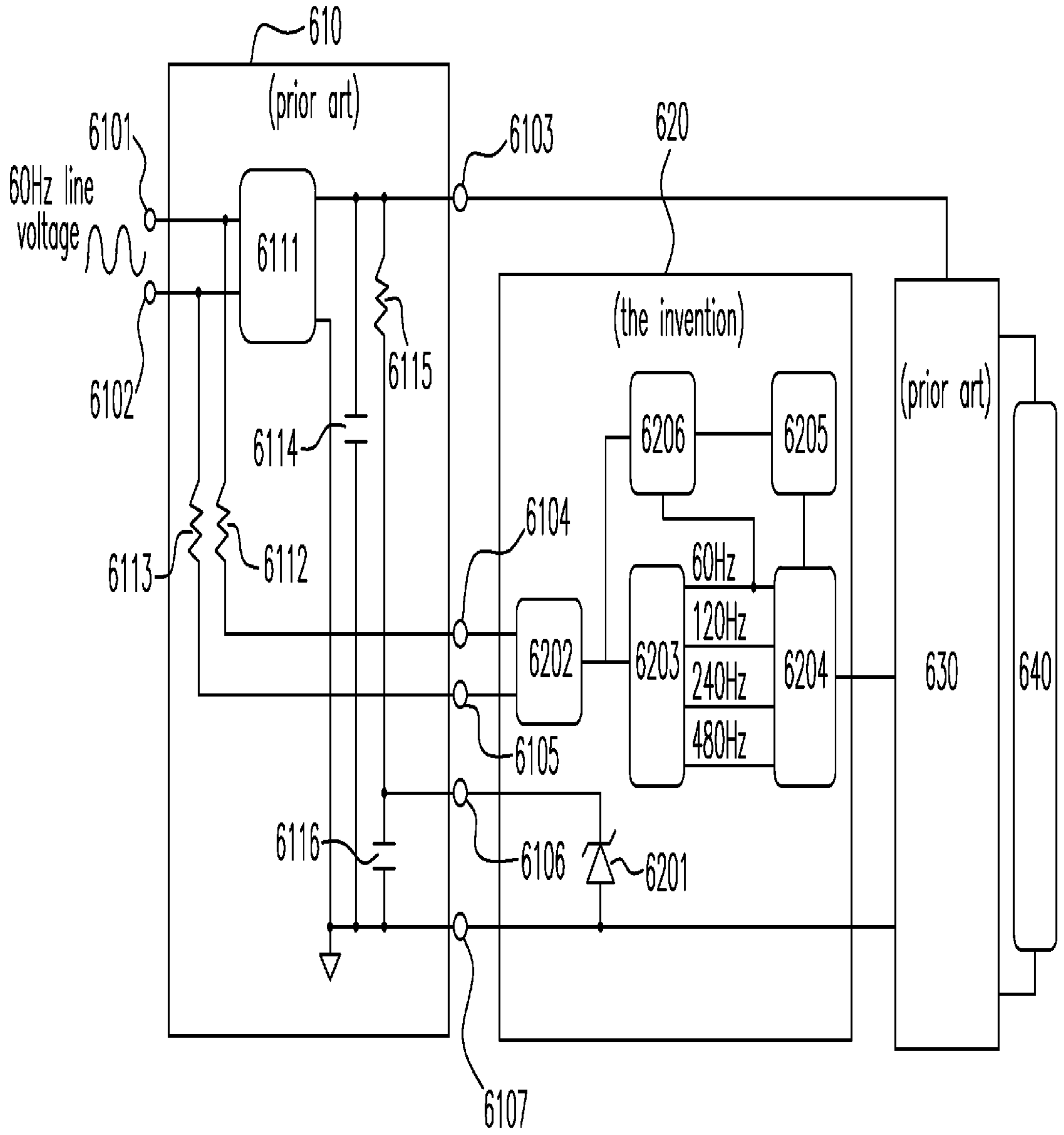
FIG. 6 shows a second application of the present invention used in a lamp.

Please refer to FIG. 6, which shows a second application of the present invention used in a lamp. In this application a rectifier circuit 610 is coupled to a control device 620 and a ballast 630, and the ballast 630 is coupled to at least one lamp 640 such as a CCFL or the other types of lamps described previously. The control device 620 functions as the fourth preferred embodiment 500 and comprises a shunt regulator 6201, a differential voltage detector 6202, a PLL 6203, a duty cycle selector 6204, a finite state machine 6205 and an interrupt duration qualifier 6206.

The rectifier circuit 610 has: a first 6101 and a second 6102 input terminal receiving an AC power line voltage such as a 60 HZ line voltage; a first output terminal 6103 coupled to the ballast 630 and providing a rectified direct current voltage; a second 6104 and a third 6105 output terminal coupled to the differential voltage detector 6202; a fourth output terminal 6106 coupled to the shunt regulator 6201; and a ground terminal 6107 for both the control device 620 and the ballast 630.

The rectifier circuit 610 further includes: a full bridge rectifier 6111 coupled to the first input terminal 6101, the second input terminal 6102, the first output terminal 6103 and the ground terminal 6107 for creating a DC voltage from the AC power line voltage; a first resistor 6112 coupled between the first input terminal 6101 and the second output terminal 6104; a second resistor 6113 coupled between the second input terminal 6102 and the third output terminal 6105; a first capacitor 6114 acting as a filter and coupled between the first output terminal 6103 and the ground terminal 6107 for smoothing out the ripples from the rectifier 6111; a third resistor 6115 coupled to the first output terminal 6103 for providing low voltage power to the control device 620; and a second capacitor 6116 coupled between the third resistor 6115 and the ground terminal 6107 for storing energy to keep the internal power supply of the control device 620 alive when the AC power line voltage is momentarily interrupted.

The duty cycle selector 6204 is coupled to the ballast 630 and provides a PWM control signal synchronized to the AC power line voltage and having a frequency of integer multiples of the AC power line frequency to dim the lamp 640.

Figure 7:
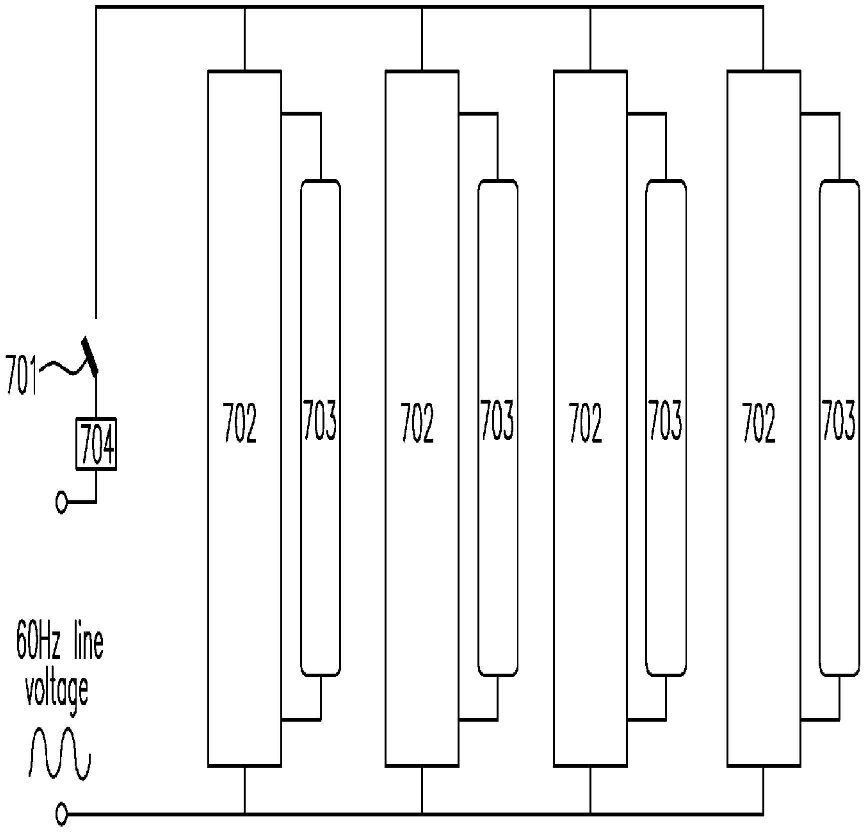
FIG. 7 shows a third application of the present invention using four lamps.

Please refer to FIG. 7, which shows a third application of the present invention used in lamps. In this application each lamp 703 is driven and dimmed by a device 702, which is a ballast in combination with the invention, based on the actions of a switch 701. Each lamp/ballast/invention combination can be located in physically distinct locations. The only requirement is that they be driven by the same AC line voltage circuit. A circuit 704 is further applied to this application whereby the user could set the lamp 703 for the desired brightness which would cause the electronic circuitry of the circuit 704 to interrupt the AC power at the proper times or predetermined time in a day to achieve the desired brightness.

Figure 8:
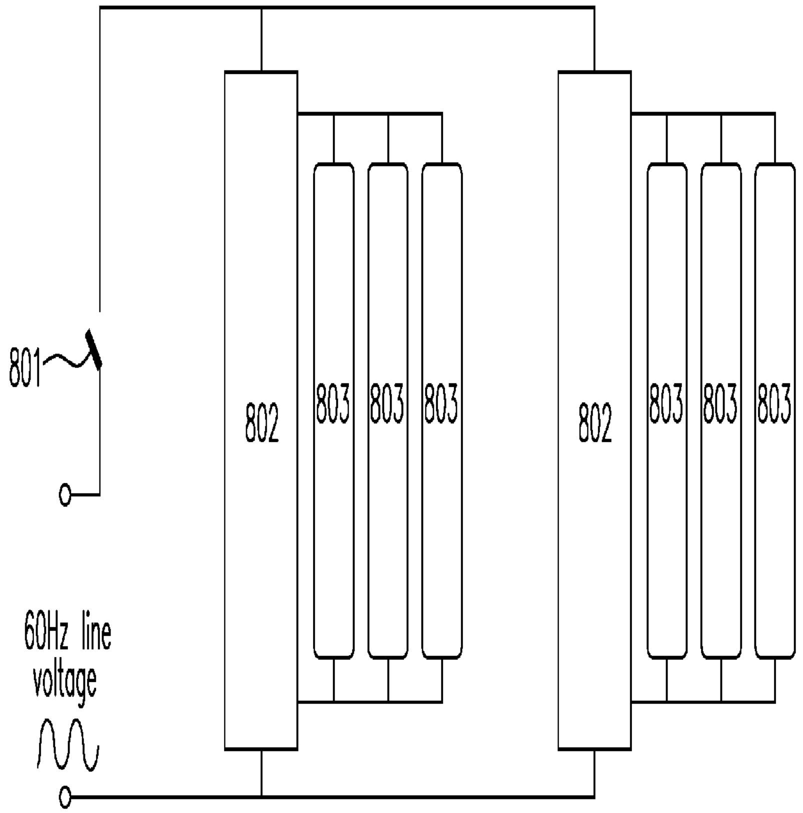
FIG. 8 shows a fourth application of the present invention using multiple lamps.

Please refer to FIG. 8, which shows a fourth application of the present invention used in multiple lamps. In this case each device 802, which includes ballast and the present invention, is capable of driving and dimming multiple lamps 803. A switch 801 is used to turn on power and make interruptions.

Figure 9:
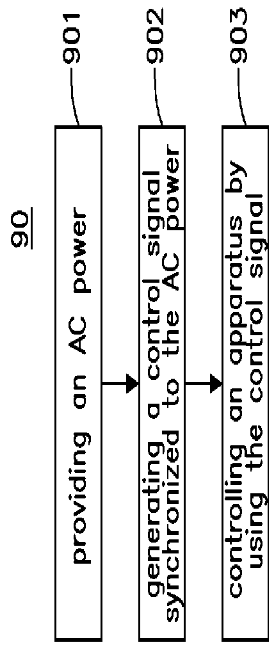
FIG. 9 shows a flow chart of the present invention.

Please refer to FIG. 9, which shows a first flow chart of the present invention. Method 90 starts with providing an AC power, which is preferably a 60 Hz line voltage (step 901). A device of the present invention then generates a control signal synchronized to the AC power (step 902), which can be a PWM control signal or an appropriate analog control signal. Finally, the device controls an apparatus by the control signal (step 903). When controlling a group of apparatus with the same AC power, using this method can solve problems of beating caused by a difference between frequencies. This method is further applied to control lamps, for instance an electronic circuit used to dim a lamp by creating a control signal that turns on and off with a fixed frequency but a varying duty cycle. Interruptions of the AC power supply to the lamp that are of proper duration (neither too long nor too short) are sensed by this electronic circuit and are used to move this circuit from one state to the next. Each state corresponds to a particular value of the duty cycle for the given control signal. Interruptions that are longer than the said proper duration reset the given electronic circuit to some initial state. Interruptions that are shorter than a predetermined duration are ignored. The phase of the control signal is synchronous to the AC power supply of the lamp. The particular duty cycles are fractions of a base period derived from proper combinations of integer multiples of the AC power supply frequency.

Figure 10:
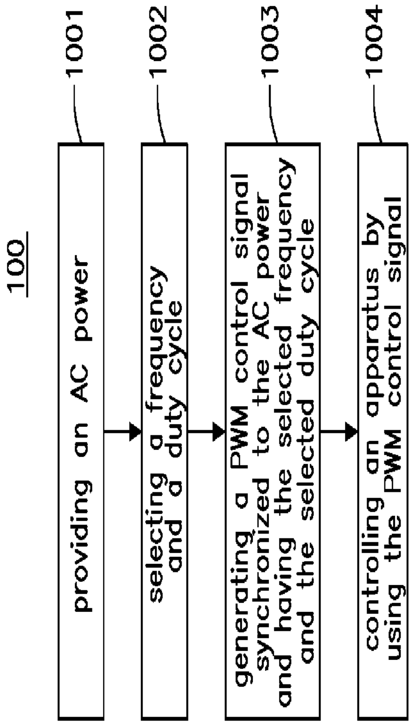
FIG. 10 shows a second flow chart of the present invention.

Please refer to FIG. 10, which shows a second flow chart of the present invention. Method 100 begins with providing an AC power, which is preferably a 60 Hz line voltage (step 1001). A frequency and a duty cycle are then selected by a programmed algorithm for need (step 1002), and a device of the present invention generates a PWM control signal synchronized to the AC power and having the selected frequency and the selected duty cycle (step 1003). Finally, the device controls an apparatus, usually lamps, by the PWM control signal (step 1004).

The method and device of the present invention are mainly applied to adjusting lamp brightness but could be used for controlling other electrical apparatus as well. The invention when used to control lamp brightness consists of an electrical circuit, most likely an integrated circuit, that would reside in or near the normal electronic ballasting circuit of a modern fluorescent lamp or other lighting device such as a WLED (white light emitting diode) or CNT (carbon nanotube), that is supplied from an AC power source (normally 50 Hz or 60 Hz but the actual frequency is unimportant). The electrical circuit of the invention is, in general, a low voltage circuit that would take its power from the ballasting or control circuitry in the form of a tertiary winding from a transformer or even from a bleed resistor across the rectified AC input voltage as shown in FIGS. 4 and 6.

The invention described in this disclosure would sense when electrical power becomes available and would send a control signal to the ballasting circuit indicating that it should operate at some low level of brightness or power (say 25%) by either sending out a PWM signal with duty ratio of 25% or an appropriate analog signal for the particular ballast in question. At the same time it initiates a phase locked loop (PLL) that synchronizes itself to the incoming AC power signal. The frequency of the dimming signal is synchronized to the AC power signal. This means that every lamp on the same AC power line is synchronized to the same time base. The duty ratio is also easily derived from multiples of the AC line frequency so that every lamp using the same AC power signal would be using the same dimming frequency and same duty cycle. An accurate analog control signal can also be obtained by using the precise duty factors available from the invention's PLL.

The invention would hold the lamp brightness at this low level indefinitely if there were no interruptions of the AC line voltage. However, if the invention senses that the AC power has been interrupted for a period of time longer than some minimum value (tmin) and shorter than some maximum value (tmax) it will change the brightness from the first low level to a second higher brightness level (50%). If the power interruption is longer than a certain maximum time (tmax) then the invention will reset back to its first state.

If there are no further changes to the AC voltage then the invention will hold the lamp brightness at its current level (50% in this case) indefinitely. However, if another interruption of proper duration occurs, as in the previous paragraph, then the brightness will again increase to some higher level (75% for the purposes of this discussion). The next AC power supply interruption of proper duration will cause the invention to provide a control signal so that the lamp is set to its highest brightness setting. After the lamp achieves its highest brightness setting subsequent interruptions of proper duration cause the lamp intensity to decrease back down to its original brightness level. For instance, using the previous examples, the lamp brightness would start at 25%, move to 50%, then 75%, then 100%, then 75%, then 50%, 25%, then 50%, then 75% and so on. Each interruption of the AC power supply (of proper duration) moves the lamp to its next brightness setting.

Figure 11:
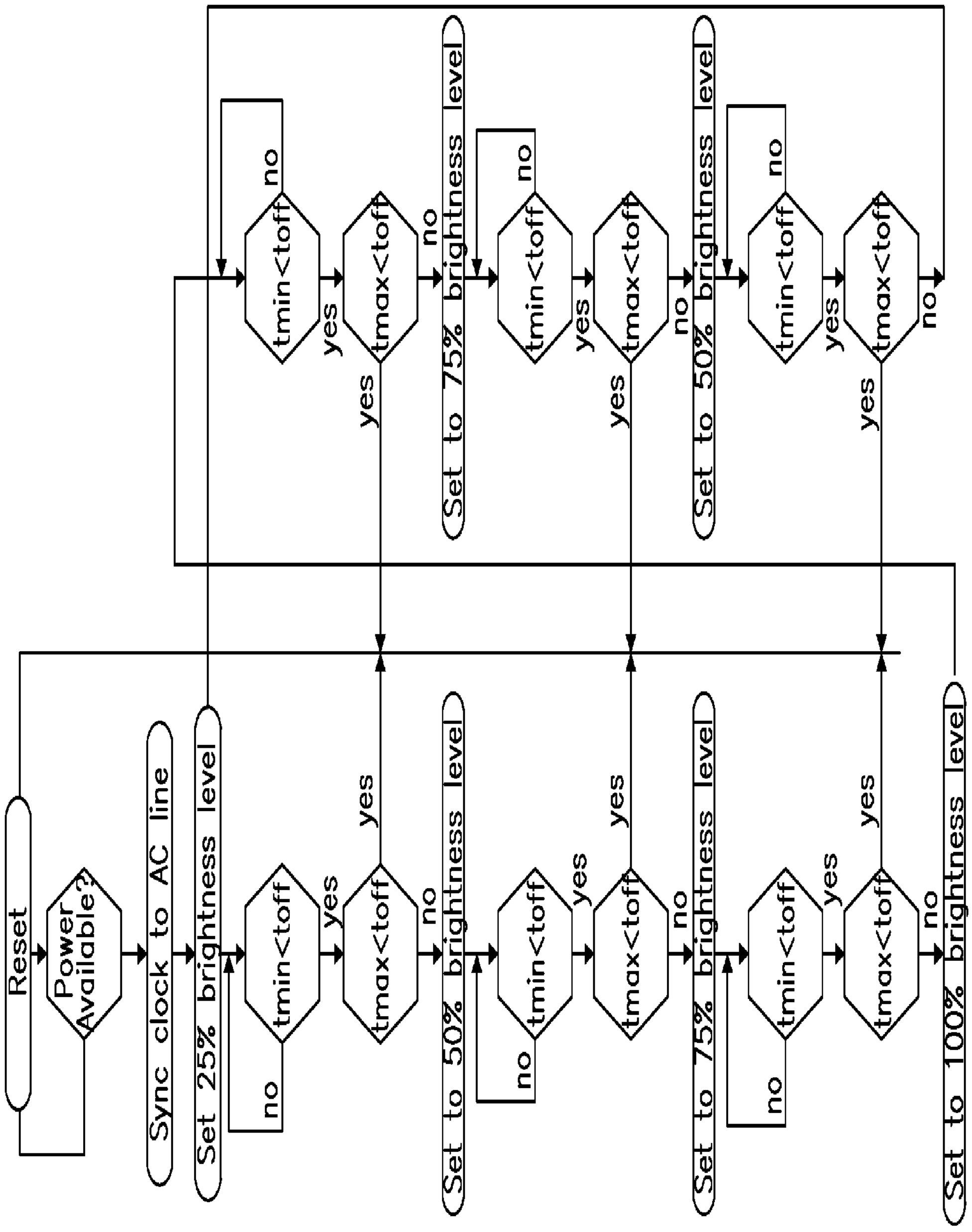
FIG. 11 shows a first algorithm of the present invention.

From the user's point of view this is what happens: The user turns on the switch and sees the lamp light up to a low value. If the user wants this value of brightness, then the user does nothing. If the user wants a brighter light, then he or she turns the switch off and then on quickly and the lamp intensity increases. If this brightness level is desired, the user does nothing and the lamp will remain at the current intensity. This brightness selection process continues until 100% brightness is reached, at which point subsequent toggling of the lamp switch will cause the lamp intensity to decrease. A first algorithm of the present invention describing this operation is seen in FIG. 11, where the duration of the interruption is presented by "toff".

Figure 12:
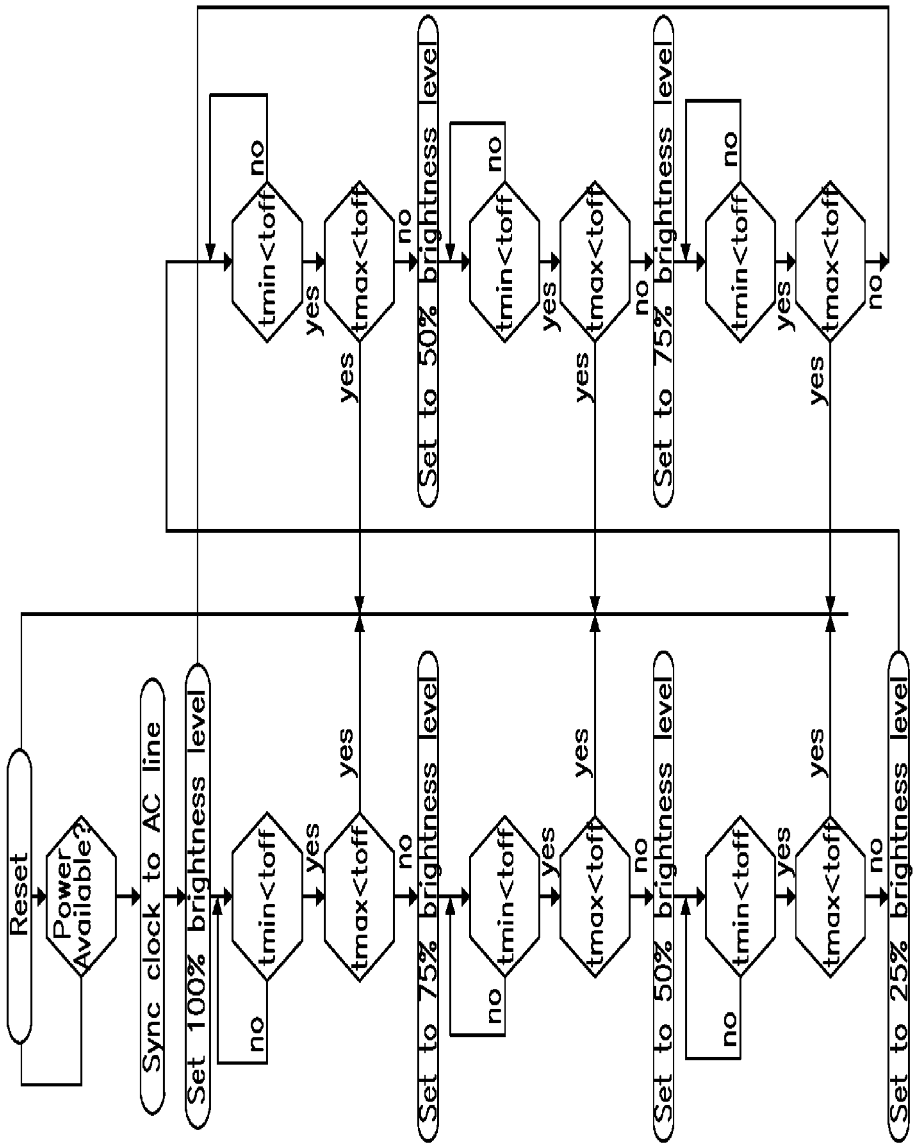
FIG. 12 shows a second algorithm of the present invention.

Some variations of the preceding scheme are readily apparent. For instance it might be advantageous, when AC power is first applied to the lamp, to cause the lamp to start at 100% brightness. Please refer to FIG. 12, which shows a second algorithm of the present invention exhibiting this behavior. Subsequent interruptions of the AC power supply would cause the brightness to decrease before eventually increasing back up to 100%. Note that another option would be to use brightness levels other than 25%, 50%, 75% and 100%.

Figure 13:
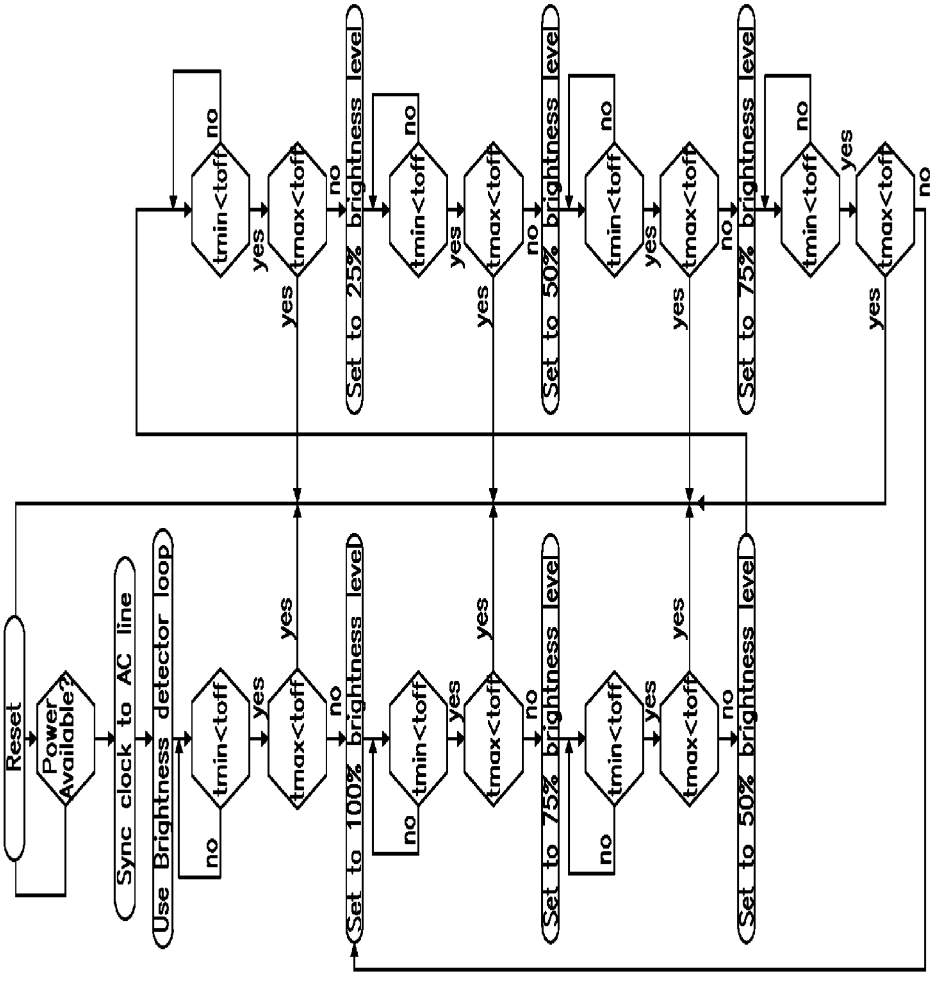
FIG. 13 shows a third algorithm of the present invention.

Another variation would involve the addition of a light sensor to provide ambient light feedback information. Consider the situations found in FIGS. 2, 2*a*, and 2*b*. The brightness sensor control loop could be one state of several other manual brightness setting states. For instance when power is first turned on, the invention would use the brightness sensor to determine the appropriate duty factor of the PWM dimming signal. After the first valid power supply interruption was sensed the brightness setting would be set to 100%, the next valid power supply interruption would set the brightness to 75%, subsequent power supply interruptions would produce brightness levels of 50%, 25%, 50%, 75%, 100%, 75% as described earlier in this application. When the power supply was interrupted for a duration longer than some maximum preset value then the lamp brightness would once again be put under the control of the brightness sensor. In this way the user could obtain automatic brightness control of the lamp or could manually override the automatic control and demand a certain fixed brightness. A flow chart describing this type of operation is found in FIG. 13, which shows a third algorithm of the present invention.

The concept can be extended to include PWM duty factors other than 25%, 50%, 75% and 100%. Similarly the order of the different brightness states may be set differently than the examples used in the previous embodiments. The brightness sensor could also be used in conjunction with different user selectable brightness settings so that the illumination in a room would remain constant regardless of ambient light, yet that constant illumination could be made brighter or less bright under user control.

Figure 14:
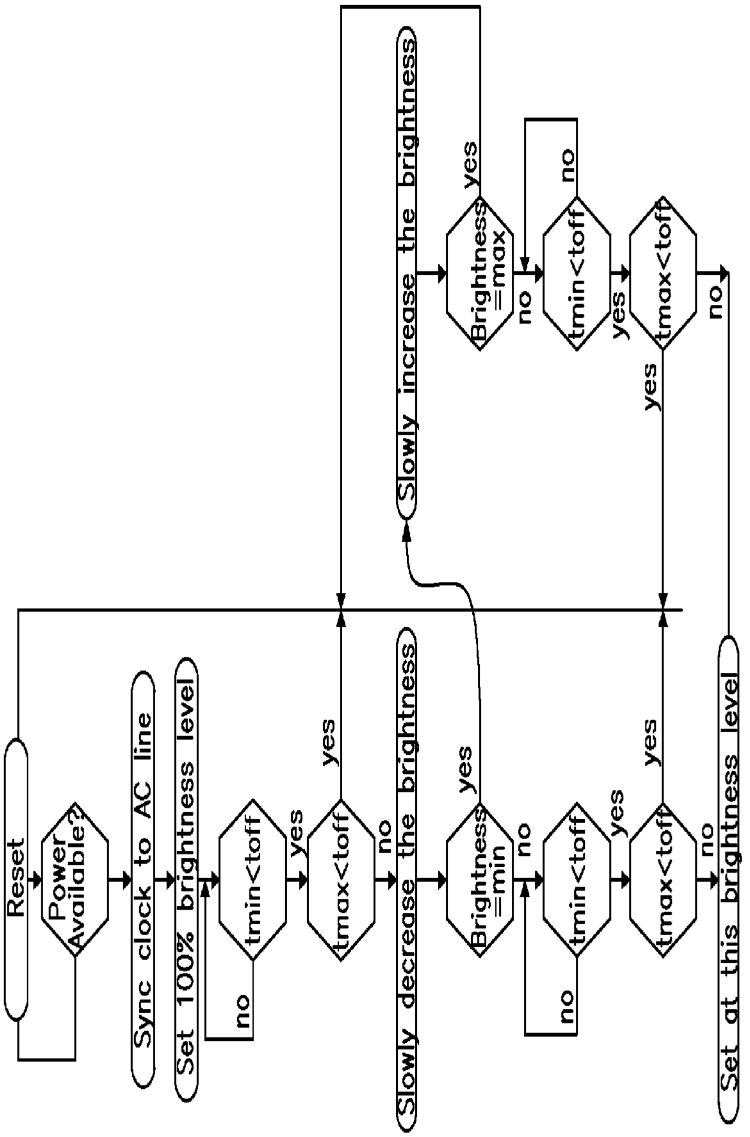
FIG. 14 shows a fourth algorithm of the present invention.

A different variation would use the first power supply interruption as the signal to start varying the brightness of the light emitting devices in a time dependent manner (increasing or decreasing automatically in a slow linear manner is the most obvious). When the level of brightness reaches the user's desired level then the user provides another power supply interruption which locks the brightness level into place. FIG. 14 shows a fourth algorithm of the present invention that exhibits this behavior.

FIG. 15*a* shows a graphical representation of how a device would work. Upon power up the duty cycle starts at some maximum value and then waits for the first power supply interruption, after which it slowly ramps the device power down to its minimum value. Without detecting any valid power supply interruptions the duty cycle will start increasing again after reaching its minimum value. It will continue in this sawtooth fashion until another valid power supply interruption is detected, at which point it will maintain the duty cycle that it exhibited at the time of the power supply interruption.

A useful variation of the behavior shown in FIG. 15*a* is shown in FIG. 15*b*. In FIG. 15*b*, upon power up the device starts with a maximum duty cycle output.

Upon the first valid power supply interruption the duty cycle ramps down slowly and continues to its minimum value if no valid power supply interruptions are detected. Upon reaching its minimum duty cycle the duty cycle starts increasing again. If no valid power supply interruption is detected then the duty cycle will reach its maximum value and stay there. It will stay in the maximum duty cycle state indefinitely if no valid power supply interruptions are detected. When a subsequent valid power supply interruption (labeled "2nd" in FIG. 15*b*) is detected it starts the cycle of falling then rising duty cycle again. When the next power supply interruption is detected (labeled "3rd" in FIG. 15*b*) it freezes the duty cycle at the value it exhibited at the time of the most recent power supply interruption. If there is no 3rd power supply interruption before the duty cycle reaches its maximum value, then the device will stay in its maximum duty cycle state indefinitely, or at least until the next valid power supply interruption is detected. For a lamp application, the advantage of the algorithm exhibited in FIG. 15*b* over the algorithm of FIG. 15*a* is that the FIG. 15*b* function will not oscillate from minimum to maximum brightness indefinitely if a user walked out of the room after initiating the first valid power supply interruption. Note that the device can start with a duty cycle of any value a user desires when initially applying power to the device.

While the invention has been described in terms of what are presently considered to be the most practical and preferred embodiments, it is to be understood that the invention need not be limited to the disclosed embodiments. On the contrary, it is intended to cover various modifications and similar arrangements included within the spirit and scope of the appended claims, which are to be accorded with the broadest interpretation so as to encompass all such modifications and similar structures. Therefore the above description and illustration should not be taken as limiting the scope of the present invention which is defined by the appended claims People skilled in the art will understand that various changes, modifications, and alterations in form and details may be made without departing from the spirit and scope of the invention.

What is claimed is:

1. A line synchronized control device, comprising:

a threshold crossing detector receiving a first input signal, detecting a first threshold crossing of the first input signal and generating a first output signal having a first specific frequency upon the detection of the first threshold crossing of the first input signal;

a phase-locked loop coupled to the threshold crossing detector and generating a second output signal having a second specific frequency being multiples of the first specific frequency and synchronized to the first output signal; and an output circuit coupled to the phase-locked loop, receiving a second input signal and generating a control signal having the second specific frequency, synchronized to the first output signal and having a specific duty cycle determined by the second input signal and by a power supply interruption by a user to control an electrical apparatus.

2. A line synchronized control device as claimed in claim 1, wherein the electrical apparatus is a lighting device having a ballast coupled to the control device and an exterior dimension of one of a T-x form factor, an Edison base bulb and a conventional lighting form factor, and the control device is configured in the lighting device and controls power levels of the electrical apparatus by the control signal.

3. A line synchronized control device as claimed in claim 2 further being configured in the ballast.

4. A line synchronized control device as claimed in claim 1, wherein the specific duty cycle is a predetermined value selected from a group of values between 0% and 100%.

5. A line synchronized control device as claimed in claim 1 further comprising a sensor providing the second input signal and coupled to the output circuit, wherein the output circuit selects the specific duty cycle.

6. A line synchronized control device as claimed in claim 5, wherein the output circuit is an analog PWM generator, and the sensor and the analog PWM generator form an analog PWM feedback loop having a switching frequency synchronized to the second specific frequency.

7. A line synchronized control device as claimed in claim 6, wherein the analog PWM generator comprises:

a ramp generator coupled to the phase-locked loop, and providing a ramp signal having the second specific frequency and synchronized to the first output signal;

a comparator coupled to the ramp generator; an error integrator coupled to the comparator and the sensor; and a voltage reference coupled to the error integrator and providing a predetermined reference signal, wherein the control signal is a PWM control signal and is generated by the comparator.

8. A line synchronized control device as claimed in claim 7, wherein the predetermined reference signal is adjusted by the power supply interruption and the specific duty cycle is determined by the second input signal, the ramp signal and the predetermined reference signal.

9. A line synchronized control device as claimed in claim 5 further comprising a plurality of states respectively representing a plurality of duty cycles including the specific duty cycle, wherein the plurality of states has an initial state, the duty cycle of the initial state is set by the sensor, and the output circuit selects the specific duty cycle by the power supply interruption.

10. A line synchronized control device as claimed in claim 1 further comprising:

an alternating current line under-voltage detector (AC Line UV Detector) receiving a third input signal and generating a third output signal if the third input signal is below a second threshold;

an interrupt duration qualifier coupled to the AC Line UV Detector and generating a fourth output signal according to the third output signal; and a finite state machine coupled to the interrupt duration qualifier and the output circuit, selecting a specific state according to the fourth output signal and generating the second input signal.

11. A line synchronized control device as claimed in claim 10, the output circuit is a duty cycle selector, the first input signal is an AC power line voltage, and the control signal is a pulse width modulated (PWM) control signal synchronized to the AC power line voltage and has a frequency being multiples of an AC power line frequency.

12. A line synchronized control device as claimed in claim 11, wherein the phase-locked loop is coupled to the interrupt duration qualifier in order to provide the interrupt duration qualifier with an accurate time base, the third output signal has a continuing duration determined by a period between two time points of turning the AC power line voltage off and then on, the interrupt duration qualifier ceases to generate an additional signal if the continuing duration is shorter than a first predetermined period, the interrupt duration qualifier generates a valid signal to the finite state machine to move the specific state to a next state if the continuing duration is larger than the first predetermined period but shorter than a second predetermined period, and the interrupt duration qualifier generates a reset signal to the finite state machine to reset the specific state to an initial state if the continuing duration is larger than the second predetermined period.

13. A line synchronized control device as claimed in claim 12, wherein the finite state machine further comprises:

the initial state with a power level of the apparatus set at 25%;

a second state with a power level of the apparatus set at 50%;

a third state with a power level of the apparatus set at 75%;

a fourth state with a power level of the apparatus set at 100%;

a fifth state with a power level of the apparatus set at 75%;

a sixth state with a power level of the apparatus set at 50%; and a seventh state is the initial state.

14. A line synchronized control device as claimed in claim 13 further comprising a ballast, a voltage regulator and a rectifier circuit comprising:

a first and a second input terminals receiving the AC power line voltage;

a first output terminal coupled to the ballast and providing a rectified direct current voltage;

a second output terminal coupled to the AC Line UV Detector and providing the third input signal;

a third output terminal coupled to the voltage regulator and providing a power;

a fourth output terminal coupled to the zero-crossing detector and providing the AC line voltage;

a ground terminal providing a negative supply for the device;

a full bridge rectifier coupled to the first input terminal, the second input terminal, the first output terminal and the ground terminal;

a first resistor coupled between the second input terminal and the fourth output terminal;

a first capacitor being a filter and coupled between the first output terminal and the ground terminal;

a resistor divider coupled to the first output terminal, the ground terminal and the second output terminal;

a fourth resistor coupled to the first output terminal; and a second capacitor coupled between the fourth resistor and the ground terminal, storing an energy and providing the power.

* * * * *